United States Patent [19]

Kimoto et al.

[11] Patent Number: 5,100,763
[45] Date of Patent: Mar. 31, 1992

[54] WATER DEVELOPABLE PHOTOSENSITIVE RESIN COMPOSITION, AND RESIN OR PRINTING PLATE THEREFROM

[75] Inventors: Koichi Kimoto, Hirakata; Yasushi Umeda, Kusatsu; Chitoshi Kawaguchi, Soraku; Toshitaka Kawanami, Nishinomiya, all of Japan

[73] Assignee: Nippon Paint Co., Ltd., Osaka, Japan

[21] Appl. No.: 494,917

[22] Filed: Mar. 12, 1990

Related U.S. Application Data

[63] Continuation of Ser. No. 144,820, Jan. 15, 1988, abandoned.

[30] Foreign Application Priority Data

| Jan. 17, 1987 | [JP] | Japan | 62-8810 |
| Jan. 17, 1987 | [JP] | Japan | 62-8811 |
| Jan. 17, 1987 | [JP] | Japan | 62-8812 |
| Jan. 17, 1987 | [JP] | Japan | 62-8813 |

[51] Int. Cl.$^5$ .................. G03F 7/033; G03F 7/30
[52] U.S. Cl. .................. 430/285; 430/281; 430/909; 430/306; 430/325; 430/327; 430/288; 522/121; 522/123; 522/120
[58] Field of Search ............ 430/909, 306, 325, 327, 430/281, 288, 285; 522/121, 123, 120

[56] References Cited

U.S. PATENT DOCUMENTS 2,902,365  9/1959  Martin ............... 430/909 X
4,621,044 11/1986  Fujikawa .............. 430/281

FOREIGN PATENT DOCUMENTS 0084851  8/1983  European Pat. Off. .
0196571  6/1986  European Pat. Off. .

OTHER PUBLICATIONS

Photocurable Liquid Resin Composition, Abstract of Japan APP56-131609, from Patent Abstracts of Japan, Jun. 16, 1982.
Research Disclosure 24919, "Process for Producing a Photosensitive Composition by Melt Extrusion," Jan. 1985.

Primary Examiner—Cynthia Hamilton
Attorney, Agent, or Firm—Gregory Garmong

[57] ABSTRACT

Disclosed is a water-developable photosensitive resin composition capable of hot melt molding, which comprises:
(i) a water soluble or water dispersible polyvinyl alcohol prepared by saponifying a copolymer of a vinyl ester and another copolymerizable monomer, which has a saponification degree of the vinyl ester unit of 50 to 70 mol % and a hot melt flow starting temperature of 60° to 130° C.,
(ii) a polymerizable monomer, and
(iii) a photopolymerization initiator.

23 Claims, No Drawings

WATER DEVELOPABLE PHOTOSENSITIVE RESIN COMPOSITION, AND RESIN OR PRINTING PLATE THEREFROM

This application is a continuation of application Ser. No. 144,820, filed Jan. 15, 1988, now abandoned.

FIELD OF THE INVENTION

The present invention relates to a water-developable photosensitive resin composition capable of hot melt molding, a resin or printing plate therefrom.

BACKGROUND OF THE INVENTION

There has been known a water-developable photosensitive resin composition for forming a relief printing plate or a resist pattern. These photosensitive resin compositions are generally composed of a water-soluble or water-dispersible polyvinyl alcohol, a polymerizable monomer and a photopolymerization initiator. The compositions, when used, are subjected to light through a negative film having an image to form a latent image by means of photopolymerization and then the unexposed part is washed with water.

For obtaining a photosensitive resin plate by using the photosensitive resin composition, the polyvinyl alcohol is primarily dissolved in water followed by the addition of the polymerizable monomer and initiator to form a mixture. The mixture is then coated on a substrate and water is evaporated to form a photosensitive resin plate. In this process, since a drying step is indispensable for the evaporation of water, it requires a large scale apparatus and consumes a lot of time and energy. Also, since most of the polymerizable monomers to be formulated into the photosensitive resin composition are relatively low molecular weight or have relatively low boiling points, environmental pollution often comes into question because of volatilization of the monomer during the drying step.

SUMMARY OF THE INVENTION

The present invention provides a photosensitive resin composition which is capable of hot melt molding and which therefore does not require a drying step. The present invention provides a water-developable photosensitive resin composition capable of hot melt molding, which comprises:

(i) a water soluble or water dispersible polyvinyl alcohol prepared by saponifying a copolymer of a vinyl ester and another copolymerizable monomer, which has a saponification degree of the vinyl ester unit of 50 to 70 mol % and a hot melt flow starting temperature of 60 to 130° C.,
(ii) a polymerizable monomer, and
(iii) a photopolymerization initiator.

The present invention also provides a method for preparing a water-developable photosensitive resin plate suitable for the manufacture of a relief printing plate, which comprises applying by hot melt molding the above water-developable photosensitive resin composition to a substrate.

BRIEF EXPLANATION OF PRIOR ART

Japanese Patent Publication (unexamined) No. 131609/1981 discloses a photocurable resin liquid composition comprising a polyvinyl ester containing —COOX and/or —SO$_3$X (wherein X represents hydrogen, an alkali metal or NH$_4$) and/or a saponified composition thereof, an active-hydrogen containing acrylic monomer and a photopolymerization initiator. This publication clearly states that the composition is liquid. Accordingly, it is not needed to apply hot melt molding to the composition.

Japanese Patent Publication (unexamined) No. 217036/1986 discloses a water-developable photosensitive composition comprising a vinyl alcohol polymer having a thiol in the molecule, a polymerizable ethylenically unsaturated compound and a photopolymerization initiator. There is no teaching about hot melt molding.

DETAILED DESCRIPTION OF THE INVENTION

The polyvinyl alcohol (i) employed in the present invention is prepared by saponifying a copolymer of a vinyl ester and another copolymerizable monomer. This other monomer copolymerizable with the vinyl ester can be an ionic group-containing monomer (hereinafter referred to as "ionic monomer"), a monomer not having an ionic group (hereinafter referred to as "nonionic monomer") or a mixture thereof.

In case where the ionic monomer is incorporated into the polyvinyl alcohol, the ionic monomer should be employed in an amount of 0.1 to 10 mol %, preferably 0.2 to 7 mol %, more preferably 0.2 to 5 mol % based on the total amount of the monomer components of the obtained polymer. If the ionic monomer is less than 0.1 mol %, the obtained photosensitive resin composition is difficult to fuse. If it is more than 10 mol %, the composition is difficult to keep in a solid state.

In case where the nonionic monomer is incorporated into the polyvinyl alcohol, the nonionic monomer should be employed in an amount of 0.1 to 20 mol %, preferably 5 to 15 mol %, more preferably 5 to 10 mol % based on the total amount of the monomer components of the obtained polymer. If the nonionic monomer is less than 0.1 mol %, the obtained photosensitive resin composition is difficult to fuse. If it is more than 20 mol %, the composition is difficult to keep in a solid state. In this case, the ionic monomer can be employed in an amount of 0 to 10 mol %, preferably 0 to 3 mol %, more preferably 0 to 2.5 mol % based on the total amount of the monomer components of the obtained polymer. Under any circumstances, a total amount of the other monomer is not over 20 mol % based on the total amount of the monomer components of the obtained polymer. Preferably, the total amount of the nonionic monomer and the ionic monomer is within the range of 0.1 to 20 mol %, more preferably 0.2 to 15 mol % based on the total amount of the monomer components of the obtained polymer. Amounts more than 20 mol % adversely affect a solid state of the obtained photosensitive resin composition. If the other monomer is less than 0.1 mol %, the obtained resin composition is difficult to fuse.

Examples of the vinyl esters employed in the present invention are vinyl formate, vinyl acetate, vinyl propionate, vinyl benzoate and the like. Vinyl acetate is preferred.

The ionic monomer is one which has an ionic group and a vinyl group for copolymerizing with the vinyl ester. Examples of the ionic groups are a carboxyl group or a salt thereof, a sulfonic acid group or a salt thereof, a phosphoric acid group or a salt thereof, an amino group, an ammonium group and the like. Examples of the ionic monomers are (meth)acrylic acid, itaconic acid, maleic acid, maleic anhydride, fumaric acid, 2-acrylamide propanesulfonic acid, (meth)allylsulfonic acid, and a salt thereof if existent, and (meth)acrylamidepropyltrimethylammonium chloride. Preferred ionic monomers are (meth)acrylic acid, itaconic acid, maleic anhydride, 2-acrylamide propanesulfonic acid and (meta)allylsulfonic acid. The ionic monomer enhances water-solubility even in a small amount.

Examples of the nonionic monomers are not specifically limited, but vinyl monomers having 2 to 12 carbon atoms are preferred. Examples of the nonionic monomers are an alpha-olefin, such as ethylene, propylene, 1-butene, isobutene and the like; a (meth)acrylic acid ester, such as methyl (meth)acrylate, ethyl (meth)acrylate, butyl (meth)acrylate and the like; (meth)acrylamide; N,N-dimethylacrylamide; N-vinylpyrrolidone; allyl acetate; allyl alcohol; 2-methyl-3-butene-2-ol; isopropenyl acetate; and the like. Preferred are a (meth)acrylate, N,N-dimethylacrylamide, N-vinylpyrrolidone, allyl acetate, allyl alcohol, 2-methyl-3-butene-2-ol, and isopropenyl acetate.

The polyvinyl alcohol of the present invention requires the following properties: (a) The obtained photosensitive resin composition has a suitable melt viscosity. (b) The polyvinyl alcohol is well compatible with the polymerizable monomer (ii). (c) The polyvinyl alcohol is water-soluble or water-dispersible. By the wording "water-soluble or water-dispersible" is meant that a vinyl alcohol polymer is completely dissolved or dispersed when it is dissolved in water to a concentration of 1% by weight at 25° C. (d) The obtained photosensitive resin composition has good dimensional stability, that is, it has good creep resistance (against heat) for shape retention. In order to meet the required properties, it is necessary that the polyvinyl alcohol of the present invention has a saponification degree of the vinyl ester unit of 50 to 70 mol % and a hot melt flow starting temperature of 60 to 130 ° C. It is, also, desired that the polyvinyl alcohol has an average polymerization degree of not more than 1,000, preferably not more than 700, more preferably within the range of 100 to 500. By "hot melt flow starting temperature" herein is meant a temperature at which a polyvinyl alcohol having a water content of 3 weight % starts to flow when heated at 6° C./min under a load of 50 Kg in a flow tester equipped with a nozzle having a diameter of 1 mm and a length of 1 mm. The hot melt flow starting temperature of the present invention is preferably 70° to 120 ° C., more preferably 80° to 100° C. If the temperature is more than 130° C., extruding of the resin becomes too difficult due to partial polymerization of the composition by heat. If the temperature is less than 60° C., the composition is difficult to keep in a solid state. A saponification degree of the vinyl ester unit, although it varies depending on the content of the other monomers, is within the range of 50 to 70 mol % because of the compatibility with the polymerizable monomer (ii). Preferably, it is within the range of 55 to 68 mol %, more preferably 60 to 67 mol %. Degrees more than 70 mol % become unsuitable due to an elevated hot melt flow starting temperature. Degrees less than 50 mol % become difficult to use because a dimensional stability of the resin plate and water solubility decline. The average polymerization degree ($\bar{p}$) is calculated according to the viscosity formula using an intrinsic viscosity ($\eta$) measured at 30° C. in water. If the polyvinyl alcohol has an average polymerization degree of more than 1,000, its melt viscosity becomes too high. If it is less than 100, it is difficult to keep the polymerizable monomer (ii) in the resin composition.

The polymerizable monomer (ii) is a compound which has a polymerizable double bond per molecule. Examples of the polymerizable monomers are methyl acrylate, ethyl acrylate, n-propyl acrylate, beta-hydroxyethyl acrylate, beta-hydroxypropyl acrylate, polyethylene glycol monoacrylate, polypropylene glycol monoacrylate, polyethylene glycol diacrylate, polypropylene glycol diacrylate, methoxypolyethylene glycol monoacrylate, ethoxypolyethylene glycol monoacrylate, glycerol diacrylate, pentaerythritol diacrylate, trimethylolpropane triacrylate, tetramethylolmethane tetraacrylate, methyl methacrylate, ethyl methacrylate, n-propyl methacrylate, beta-hydroxyethyl methacrylate, beta-hydroxypropyl methacrylate, polyethylene glycol monomethacrylate, polypropylene glycol monomethacrylate, polyethylene glycol dimethacrylate, polypropylene glycol dimethacrylate, methoxypolyethylene glycol monomethacrylate, ethoxypolyethylene glycol monomethacrylate, glycerol dimethacrylate, pentaerythritol dimethacrylate, trimethylolpropane trimethacrylate, tetramethylolmethane tetramethacrylate, acrylamide, N-methylol acrylamide, N-(butoxymethyl)acrylamide, isobutoxy acrylamide, N-(t-butyl)acrylamide, methylene-bis(acrylamide), ethylene-bis(acrylamide), propylene-bis(acrylamide), methacrylamide, N-(methylol)methacrylamide, N-(n-butoxymethyl)methacrylamide, N-isobutoxymethyl)methacrylamide, N-(t-butyl)methacrylamide, methylene-bis(methacrylamide), ethylene-bis(methacrylamide), propylene-bis(methacrylamide), butylcarbamoyloxyethyl (meth)acrylate and a mixture thereof.

The polymerizable monomer (ii) may be the specific monomer having at least two free hydroxyl groups and the following formula:

$$\begin{array}{c} CH_2-X \\ | \\ CH-OH \\ | \\ CH_2-Y \end{array} \quad (I)$$

wherein X represents

Y represents

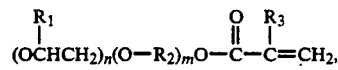

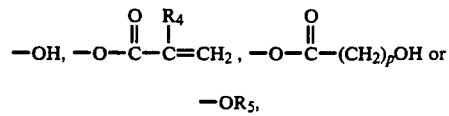

wherein $R_1$, $R_3$ and $R_4$, which are the same or different, respectively represents a hydrogen atom or a methyl group, $R_2$ represents an alkylene group having 1 to 5 carbon atoms and a hydroxyl group, $R_5$ represents an alkyl group having 1 to 5 carbon atoms and a hydroxyl group, n is an integer of 4 to 23, m is 0 or 1 and p is an integer of 1 to 5. Examples of the specific monomers (I) are

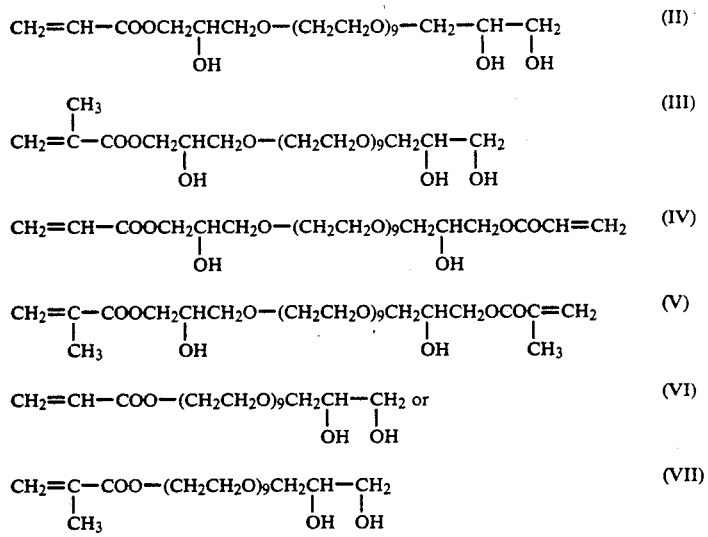

The specific monomer (I) can also be a derivative in which a terminal hydroxyl group is esterified with acrylic acid or methacrylic acid. The specific monomer (I) may be mixed with the other nonspecific monomer listed above. The specific monomer (I) imparts a suitable hardness and rubber resilience to a cured resin composition.

The polymerizable monomer (ii) is selected in view of compatibility with the polymer employed. In order to improve the compatibility, a suitable solvent, for example, water, an alcohol having a high boiling point, such as ethylene glycol, diethylene glycol, propylene glycol, triethylene glycol, butanediol, trimethylolpropane, tetramethylolpropane, glycerol and diglycerol may be formulated.

The polymerization initiator (iii) is not specifically limited, but an aromatic ketone is generally employed. The aromatic ketone is a compound which has an aromatic ring and a carbonyl group in one molecule, and benzoin isopropyl ether, alpha-methylbenzoin, 1-methylanthraquinone, 9-fluorenone, benzyl, benzyl methyl ketal, acetophenone, 2,2'-dimethoxy-2-phenylacetophenone, benzophenone, phenyl-2-thienylketone, p-dimethylaminobenzophenone, p,p'-tetramethyldiaminobenzophenone and the like. The aromatic ketone may contain a substituent, such as cyano, nitro, methoxy, sulfonic acid, phosphine acid, a salt or an ester thereof. Representative examples of such substituted aromatic ketones are 2,6-dimethoxybenzoyl-diphenylphosphine oxide, 2,4,6-trimethylbenzoyl-diphenylphosphine oxide, an ester of 2,4,6-trimethylbenzoyl-phenylphosphinic acid, a sodium salt of 2,4,6-trimethylbenzoyl-phenylphosphinic acid and the like.

The polyvinyl alcohol (i) is generally formulated into the resin composition of the present invention in an amount of 50 to 300 parts by weight, preferably 60 to 250, parts by weight, more preferably 70 to 200 parts by weight based on 100 parts by weight of the polymerizable monomer (ii). The polymerization initiator (iii) is generally formulated into the resin composition in an amount of 0.01 to 10 parts by weight, preferably 0.02 to 5 parts by weight, more preferably 0.03 to 4 based on 100 parts by weight of the monomer (ii).

The water-developable photosensitive resin composition of the present invention may further contain an additive. The additive includes a polymerization inhibitor, such as 2,6-di-t-butyl-p-cresol, hydroquinone and p-methoxylphenol; a dye, such as Rose Bengale, eosine, methylene blue or malachite green; and the like.

Since the photosensitive resin composition of the present invention employs a particular polyvinyl alcohol (i), it is capable of hot melt molding. Hot melt molding is generally conducted by an extruder, a kneader, a hot press machine and the like. According to the present invention, the process for making a photosensitive resin plate can be shorten and can reduce its cost, since a large scale drying step is not required. In the hot melt molding process, water may be added for plasticizing the resin composition, but the amount of water to be added is very small in comparison with a conventional method mentioned above. A water content in the resin composition including water added is preferably not more than 10 parts by weight, more preferably within the range of 3 to 8 parts by weight based on the amount of the photosensitive resin composition of the present invention.

According to the present invention, the photosensitive resin composition is molded onto a suitable substrate to obtain a photosensitive resin plate. Examples of the substrates are metal, such as aluminum, zinc and iron; plastics, such as polyethylene terephthalate, polystyrene, polymethylmethacrylate, nylon, cellulose acetate, polyethylene, polypropylene, polycarbonate, polyacrylonitrile and polyvinylchloride; glass; a natural or synthetic rubber, a rubber foam and any combination or laminate thereof; and the like. The substrate may be preliminarily surface-treated by etching, electrolytic oxidation, corona discharge and the like. Also, the substrate may be covered with an adhesive layer, an antihalation layer and the like.

A preparation of the relief printing plate is known. For example, the photosensitive resin plate as above obtained is closely contacted with an image film, such as a negative film or a positive film, through a suitable cover layer and exposed to light. Development by washing out the photosensitive resin composition at the unexposed areas with a developer, especially water give a visible image. Exposure is conducted with actinic light sources, such as medium pressure mercury vapor lamps, high pressure mercury vapor lamps, ultra high pressure mercury vapor lamps, xenon lamps, metal halide lamps, ultraviolet, fluorescent lamps and the like. The light sources can also be tungsten lamps, white fluorescent lamps, visible light laser and the like.

The photosensitive resin composition of the present invention is water-developable and therefore is employed as various image-forming materials, such as a photoresist and the like. In case of using the monomer (I), the photosensitive resin composition has more improved water-solubility and when cured, the film has an enhanced resilience.

EXAMPLES

The present invention is illustrated by the following examples, which are not construed as limiting the invention to their details. In the Examples, "part(s)" is based on weight unless otherwise indicated.

PRODUCTION EXAMPLE 1

A reaction vessel equipped with a stirrer, a thermometer, a dropping funnel and a reflux condenser was charged with 2,800 parts of vinyl acetate, 6,500 parts of methanol and 10.5 parts of methyl acrylate. The reaction vessel was placed in a thermostatic chamber and an atmosphere inside the vessel was replaced with nitrogen under stirring followed by heating to 60° C. Then, 285 parts of a methanol solution containing 5.7 parts of 2,2'-azobisisobutylonitrile was added to the vessel to start a polymerization reaction. During the polymerization period of 5 hours, 900 parts of a methanol solution containing 180 parts of methyl acrylate was added dropwise such that a monomer ratio of methyl acrylate to vinyl acetate be kept constant during the copolymerization by measuring an amount of an obtained polymer and calculating therefrom a vinyl acetate content remaining in the reaction vessel. On the completion of the polymerization reaction, the solid content of the production was 17.8% by weight. The unreacted vinyl acetate monomer was removed by heating with introducing methanol gas in the vessel to obtain a 65% methanol solution containing a copolymer. It was identified by an NMR analysis that the obtained copolymer had a methyl acrylate unit of 10 mol % and a vinyl acetate unit of 90 mol A saponification was conducted by adding 4.0 parts by volume of a methanol solution of 2N sodium hydroxide to 100 parts of a 65% methanol solution of the polymer with stirring at 40° C. The obtained white gel was washed with a methyl acetate/methanol (7/3 weight ratio) solution followed by drying to form a polyvinyl alcohol (a). The polyvinyl alcohol (a) had a saponification degree of the vinyl ester unit of 63.8 mol % by means of an NMR analysis. The polymerization degree was 350, which was determined by using an intrinsic viscosity measured at 30° C. in water. The polyvinyl alcohol (a) had a hot melt flow starting temperature (hereinafter referred to as "flow point") of 120 ° C. by a flow tester.

PRODUCTION EXAMPLE 2

A reaction vessel was charged with 2,420 parts of vinyl acetate, 5,100 parts of methanol, 9.1 parts of methyl acrylate and 1.7 parts of sodium 2-acrylamide-2-methylpropanesulfonate. Then, 250 parts of a methanol solution containing 5.0 parts of 2,2'-azobisisobutylonitrile was added to start a polymerization reaction at 60° C. During the polymerization period of 5 hours, 720 parts of a methanol solution containing 128 parts of methyl acrylate and 13 parts of sodium 2-acrylamide-2-methylpropanesulfonate was added dropwise such that a monomer ratio of methyl acrylate and sodium 2-acrylamide-2-methylpropanesulfonate to vinyl acetate be kept constant during the copolymerization by measuring an amount of an obtained polymer and calculating therefrom a vinyl acetate content remaining in the reaction vessel. On the completion of the polymerization reaction, the solid content of the production was 16% by weight. The unreacted vinyl acetate monomer was removed as generally described in Production Example 1 to obtain a 65% methanol solution containing the copolymer. It was identified by an NMR analysis that the obtained copolymer had a methyl acrylate unit of 10 mol %, a sodium 2-acrylamide-2-methylpropanesulfonate unit of 0.4 mol % and a vinyl acetate unit of 89.6 mol %. A saponification was conducted by adding 4.2 parts by volume of a methanol solution of 2N sodium hydroxide to 100 parts of a 65% methanol solution of the copolymer with stirring at 40° C. After 30 minutes, the obtained white gel was washed with a methyl acetate/methanol (7/3 weight ratio) solution followed by drying to form a polyvinyl alcohol (b). The polyvinyl alcohol (b) had a saponification degree of the vinyl ester unit of 61.0 mol % by means of an NMR analysis. The polyvinyl alcohol (b) had a flow point of 115° C.

PRODUCTION EXAMPLE 3

A reaction vessel was charged with 1,125 parts of vinyl acetate, 150 parts of allyl acetate, 1,570 parts of methanol. An atmosphere inside the vessel was replaced with nitrogen and heated to 60° C. Then, 19.5 parts of 2,2'-azobisisobutylonitrile was added to the vessel to start a polymerization reaction. After 5 hours, when the solid content was 31%, the reaction mixture was cooled to terminate the polymerization reaction. After treating as generally described in Production Example 1, a methanol solution containing a vinyl acetate-allyl acetate copolymer (solid content of 65%) was obtained. The content of allyl acetate unit was 10.2 mol % by an NMR analysis. A saponification was conducted as generally described in Production Example 1 by adding 2.0 parts by volume of a methanol solution of 2N sodium hydroxide to 100 parts of a 65% methanol solution of the copolymer to obtain a polyvinyl alcohol (c). The polyvinyl alcohol (c) had a saponification degree of the vinyl ester unit of 66.8 mol %, a polymerization degree of 450 and a flow point of 105° C.

PRODUCTION EXAMPLE 4

A reaction vessel equipped with a stirrer, a thermometer, a dropping funnel and a reflux condenser was charged with 2,150 parts of vinyl acetate, 1,950 parts of methanol, 5 parts of itaconic acid and 75 parts 2,2-azobisisobutylonitrile. An atmosphere inside the vessel was replaced with nitrogen under stirring followed by heating to 60° C. to start a polymerization reaction. During the polymerization period of 5 hours, 305 parts of a methanol solution containing 105 parts of itaconic acid was added dropwise such that a monomer ratio of itaconic acid to vinyl acetate be kept constant during the copolymerization by measuring an amount of an obtained polymer and calculating therefrom a vinyl acetate content remaining in the reaction vessel. On the completion of the polymerization reaction, the solid content of the production was 31% by weight. The unreacted vinyl acetate monomer was removed by heating with introducing methanol gas into the vessel to obtain a 65% methanol solution containing the copolymer. It was identified by an NMR analysis that the obtained copolymer had an itaconic acid unit of 5 mol % and a vinyl acetate unit of 95 mol %. A saponification was conducted by adding 23 parts by volume of a methanol solution of 2N sodium hydroxide to 100 parts of a 65% methanol solution of the copolymer with stirring at 40° C. The obtained white gel was washed with a methyl acetate/methanol (7/3 weight ratio) solution followed by drying to form a polyvinyl alcohol (d). The polyvinyl alcohol (d) had a saponification degree of the vinyl ester unit of 57 mol % by means of an NMR analysis. The polymerization degree was 380, which was determined by using an intrinsic viscosity measured at 30° C. in water. The polyvinyl alcohol (d) had a flow point of 98° C. by a flow tester.

PRODUCTION EXAMPLE 5

A reaction vessel as employed in Production Example 1 was charged with 1,800 parts of vinyl acetate, 3,500 parts of methanol and one parts of sodium 2-acrylamide-2-methylpropanesulfonate. An atmosphere inside the vessel was replaced with nitrogen under stirring followed by heating to 60° C. Then, 150 parts of a methanol solution containing 24 parts of 2,2'-azobisisobutylonitrile was added to the vessel to start a polymerization reaction. During the polymerization period of 3 hours, 35 parts of a methanol solution containing 11 parts of sodium 2-acrylamide-2-methylpropanesulfonate was added dropwise such that a monomer ratio of sodium 2-acrylamide-2-methylpropanesulfonate to vinyl acetate be kept constant during the copolymerization by measuring an amount of an obtained polymer and calculating therefrom a vinyl acetate content remaining in the reaction vessel. On the completion of the polymerization reaction, the solid content of the production was 23.3% by weight. The unreacted vinyl acetate monomer was removed by heating with introducing methanol gas in the vessel to obtain a 65% methanol solution containing a copolymer. It was identified by an NMR analysis that the content of the sodium 2-acrylamide-2-methylpropanesulfonate unit was 0.35 mol %. A saponification was conducted by adding 11 parts by volume of a methanol solution of 2N sodium hydroxide to 100 parts of a 65% methanol solution of the copolymer with stirring at 40 ° C. The obtained white gel was washed with a methyl acetate/methanol (8/2 weight ratio) solution followed by drying to form a polyvinyl alcohol (e). The polyvinyl alcohol (e) had a saponification degree of the vinyl ester unit of 61 mol %, a polymerization degree of 350 and a flow point of 101° C.

PRODUCTION EXAMPLE 6

A two liter flask equipped with a stirrer, a condenser and a temperature controller was charged with 370 g of xylene, 526 g of a difunctional epoxy compound having the following formula:

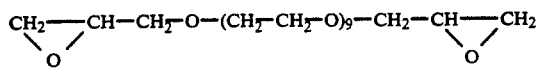

available from Kyoei-sha Yushi Kagaku Kogyo K.K. as Eporite 400E, 86 g of methacrylic acid, 18 g of water and 1 g of tetrabutylammonium chloride to obtain a mixture. The mixture was heated with stirring and maintained reflux for 30 minutes. The mixture was then cooled to obtain a polymerizable monomer. The monomer was identified by NMR and IR as the polymerizable monomer (III) having the following formula:

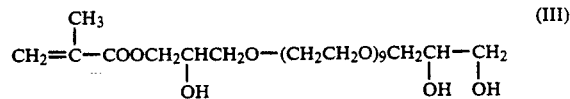

It had an acid value of 0.56 and a viscosity of 200 cps.

PRODUCTION EXAMPLE 7

The polymerizable monomer (II) having the following formula:

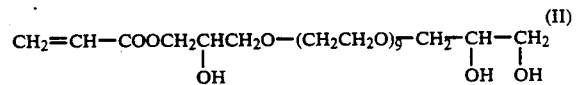

was obtained as generally described in Production Example 6 with the exception that 410 g of xylene, 526 g of the difunctional epoxy compound disclosed in Production Example 6, 72 g of acrylic acid, 18 g of water and 1 g of tetrabutylammonium chloride were charged. It had an acid value of 0.59 and a viscosity of 170 cps.

PRODUCTION EXAMPLE 8

The polymerizable monomer (IV) having the following formula

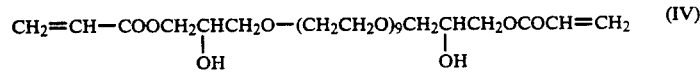

was obtained as generally described in Production Example 6 with the exception that 330 g of xylene, 526 g of the difunctional epoxy compound disclosed in Production Example 6, 144 g of acrylic acid and 1 g of tetrabutylammonium chloride were charged. It had an acid value of 5 and a viscosity of 15,000 cps.

PRODUCTION EXAMPLE 9

A two liter flask equipped with a stirrer, a condenser and a temperature controller was charged with 964 g of a polyethylene glycol monomethacrylate compound mainly comprising:

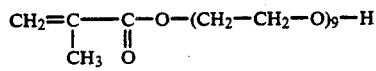

available from Nippon Oil and Fats Corporation as Blenmer PE-350, 148 g of glycidol available from Daisel Kagaku Kogyo K.K. and 11 g of dimethylbenzylamine to obtain a mixture. The mixture was mixed with blowing air and heated to a temperature of 120° C. to 140° C. at which it was maintained for one hour and then cooled to room temperature. The monomer was identified by NMR and IR as the polymerizable monomer (VII) having the following formula:

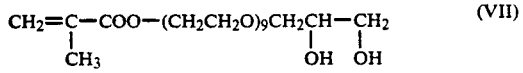

It had an acid value of 0.10 and a viscosity of 150 cps.

PRODUCTION EXAMPLE 10

The polymerizable monomer (VI) having the following formula:

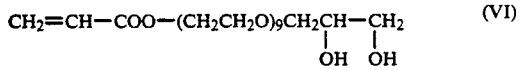

was obtained as generally described in Production Example 9 with the exception that 936 g of the polyethylene glycol monoacrylate compound, 148 g of glycidol and 11 g of dimethylbenzylamine were charged. It had an acid value of 0.12 and a viscosity of 130 cps.

EXAMPLE 1

Part A

One hundred parts of polyvinyl alcohol (a), 15 parts of ethylene glycol and 10 parts of water was kneaded at 80° to 85° C. for 30 minutes.

Part B

| Monomer mixture A | |
|---|---|
| Ingredients | Parts |
| Trimethylolpropane trimethacrylate | 20 |
| Epoxy ester 70PA[1] | 20 |
| N-Vinyl pyrrolidone | 20 |

[1] an epoxy ester available from Kyoei-sha Yushi Kagaku Kogyo K.K., having the formula:

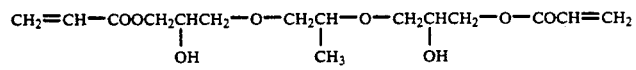

Into a mixture containing the above ingredients, 0.1 parts of p-methoxyphenol, 0.4 parts of 2,6-di-t-butyl-p-cresol and 3 parts of 2,2'-dimethoxy-2-phenylacetophenone were dissolved to form a solution. The solution was added to the kneaded mixture in part A and mixed at 80° C. for 30 minutes. The resultant mixture was fed into a twin screw extruder at 80° C., mixed, defoamed and extruded onto a pretreated steel panel coated with an antihalation layer having a thickness of 0.2 mm to form a composition layer of 0.5 mm in thickness. Then, a cover film was laminated on it to form a photosensitive resin plate.

The photosensitive surface of the resin plate was closely contacted under vacuum to a testing negative film having 150 line 3%, 5%, 10%, 20% half tone, isolated dots having a diameter of 100 microns and 200 microns, fine lines having a width of 40 microns and 60 microns, and exposed to a 3 KW high pressure mercury lamp at a distance of 70 cm. The irradiation time was 3 seconds for preirradiation and 25 seconds for main irradiation. The exposed resin plate was developed by blowing neutral water at a pressure of 4 Kg/cm² for one and half minutes at 40 ° C. using a spray developing machine. The unexposed portion, i.e. uncured portion was washed out to water to obtain a relief printing plate. The relief printing plate was dried at 100 ° C. for 2 minutes and there are no defects on 3% half tone, isolated dots having a diameter of 100 microns, and fine lines having 40 microns in width.

EXAMPLES 2 10 AND COMPARATIVE EXAMPLES 1 to 2

A photosensitive resin plate was obtained from a combination of a polyvinyl alcohol shown in Table 1 and the following polymerizable monomer as generally described in Example 1 and the same tests in Example 1 were conducted. The treating conditions and their results were shown in Table 1.

| Monomer mixture B | |
|---|---|
| Ingredients | Parts |
| N-Butoxyacrylamide | 40 |
| Kayarad R604[2] | 20 |

[2]Available from Nihon Kayaku K.K. having the formula:

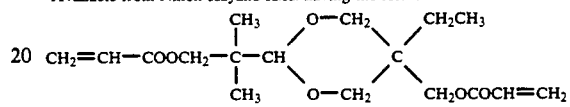

| Monomer mixture C | |
|---|---|
| Ingredients | Parts |
| NK Ester A-400[3] | 50 |
| NK Ester M-40G[4] | 10 |

[3]A compound available from Shin-nakamura Kagaku K.K. having the formula:
$CH_2=CH-COO-(CH_2CH_2O)_9-CO-CH=CH_2$

[4]A compound available from Shin-nakamura Kagaku K.K having the formula:

| Monomer mixture D | |
|---|---|
| Ingredients | Parts |
| 2-Hydroxyethyl methacrylate | 60 |

| Monomer mixture E | |
|---|---|
| Ingredients | Parts |
| $(CH_2=CHCOOCH_2CH_2O)_3-PO$ | 20 |

| Monomer mixture F | |
|---|---|
| Ingredients | Parts |
| 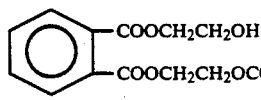 | 20 |

For a comparison, an unmodified polyvinyl alcohol (k) having a saponification degree of 60% and a polymerization degree of 200, and an unmodified polyvinyl alcohol (l) having a saponification degree of 70% and a polymerization degree of 300, which are outside of the present invention, were employed and tested in the conditions as shown in Table 1. Their results are shown in Table 1.

TABLE 1

| Examples number | Ingredients | | Treating conditions | | | | Resolving power | |
|---|---|---|---|---|---|---|---|---|
| | Polyvinyl alcohol | Monomer mixture | Pre-exposure (second) | Main-exposure (second) | Wash out time (sec) | Minimum highlight dot % | Isolated dots (micron) | Fine lines (micron) |
| 1 | a | A | 3 | 25 | 90 | 3 | 100 | 40 |
| 2 | a | B | 4 | 26 | 90 | 3 | 100 | 40 |
| 3 | b | C | 2 | 28 | 60 | 3 | 100 | 40 |
| 4 | c | D | 8 | 30 | 90 | 3 | 100 | 40 |
| 5 | c | E | 1 | 23 | 90 | 3 | 100 | 40 |
| 6 | d | A | 3 | 25 | 80 | 3 | 100 | 40 |
| 7 | d | B | 3 | 26 | 90 | 3 | 100 | 40 |
| 8 | e | A | 3 | 25 | 90 | 3 | 100 | 40 |
| 9 | e | C | 2 | 28 | 90 | 3 | 100 | 40 |
| 10 | e | F | 1 | 26 | 90 | 3 | 100 | 40 |
| Comparative Example 1 | k | A | 3 | 30 | 5 min | 10 | 200 | 150 |
| 2 | l | A | 3 | 30 | 4.5 min | 10 | 200 | 150 |

EXAMPLE 11 TO 22

A photosensitive resin plate and a relief printing plate thereof were obtained from a combination of a polyvinyl alcohol and a polymerizable monomer shown in Table 2 as generally described in Example 1 and the same tests in Example 1 were conducted. The treating conditions and their results were shown in Table 2.

Using the obtained relief printing plate, printing was carried out by a Vander-cook proofing printing machine UNIVERSAL-III, Vander-cook DIVISION, ILLINOIS TOOL WORKS INC. An optical density of the solid portion is shown in Table 2, which was determined by a Macbeth reflective densitometer.

For producing a relief printing plate, the extruded material was shaped to a photosensitive resin plate having 2 mm thickness by a hot press machine using a 2 mm of spacer. The plate was exposed to a 3 Kw high pressure mercury lamp for 5 minutes. The plate was cut to a 2 cm×2 cm plate and piled to a 12 mm thickness, of which hardness (20° C.) and impact resilience of 20° C. according to JIS K-6301 were measured.

What is claimed is:

1. A water-developable photosensitive resin composition capable of hot melt molding, which comprises:

(1) water soluble or water dispersible polyvinyl alcohol which has a saponification degree of the vinyl ester unit of 50 to 70 mol % and a hot melt flow starting temperature of 60° to 130° C.; said polyvinyl alcohol being prepared by saponifying a copolymer of
(a) a vinyl ester, and
(b) a monomer selected from the group consisting of a monomer not having an ionic group (hereinafter nonionic monomer), a salt of a sulfonic acid group-containing monomer, and a mixture thereof, said nonionic monomer when selected being present in an amount of 0.1 to 20 mol %, said salt of a sulfonic acid group-consisting monomer when selected being present in an amount of 0.1 to 0.4 mol%, and when a mixture of the monomers is selected a total amount of the monomer mixture being 0.1 to 20 mol %,
(ii) a polymerizable monomer, and
(iii) a photopolymerization initiator.

2. A water-developable photosensitive resin composition capable of hot melt molding, which comprises:

(i') a water soluble or water dispersible polyvinyl alcohol which has a saponification degree of the vinyl ester unit of 50 to 70 mol % and a hot melt flow starting temperature of 60° to 130° C.; said polyvinyl alcohol being prepared by saponifying a copolymer of
(a) a vinyl ester, and
(b') 0.1 to 10 mol % of a carboxylic acid group-containing monomer or a salt thereof,

TABLE 2

| Examples number | Ingredients | | Treating conditions | | | Resolving power | | | Printing | | Physical property | | The other Compatibility with PVA |
|---|---|---|---|---|---|---|---|---|---|---|---|---|---|
| | Polyvinyl alcohol (PVA) | Monomer | Pre-exposure (second) | Main-exposure (second) | Wash out time (sec) | Minimum highlight dot % | Isolated dots (micron) | Fine lines (micron) | Optical density | Smoothness of solid portion | Hardness | Resilience % | |
| 11 | a | III | 4 | 26 | 60 | 3 | 100 | 40 | 1.2 | Good | 50° | 27 | Good |
| 12 | b | II | 4 | 26 | 60 | 3 | 100 | 40 | 1.1 | Good | 53° | 28 | Good |
| 13 | c | III | 3 | 26 | 60 | 3 | 100 | 40 | 1.1 | Good | 50° | 29 | Good |
| 14 | c | II | 3 | 26 | 60 | 3 | 100 | 40 | 1.2 | Good | 53° | 27 | Good |
| 15 | c | IV | 3 | 25 | 70 | 3 | 100 | 40 | 1.1 | Good | 58° | 30 | Good |
| 16 | c | VI | 3 | 25 | 60 | 3 | 100 | 40 | 1.2 | Good | 52° | 30 | Good |
| 17 | d | III | 4 | 26 | 60 | 3 | 100 | 40 | 1.2 | Good | 52° | 27 | Good |
| 18 | e | II | 4 | 26 | 60 | 3 | 100 | 40 | 1.1 | Good | 53° | 28 | Good |
| 19 | e | III | 3 | 26 | 60 | 3 | 100 | 40 | 1.1 | Good | 55° | 29 | Good |
| 20 | e | II | 3 | 25 | 60 | 3 | 100 | 40 | 1.2 | Good | 60° | 30 | Good |
| 21 | e | VI | 3 | 25 | 60 | 3 | 100 | 40 | 1.1 | Good | 52° | 30 | Good |
| 22 | e | VII | 3 | 25 | 60 | 3 | 100 | 40 | 1.1 | Good | 55° | 30 | Good |

(ii') a polymerizable monomer having at least two free hydroxyl groups and represented by the following formula;

$$\begin{array}{c} CH_2-X \\ | \\ CH-OH \\ | \\ CH_2-Y \end{array}$$

wherein X represents $$-(OCHCH_2)_n(O-R_2)_m O-\overset{O}{\underset{\|}{C}}-\overset{R_3}{\underset{|}{C}}=CH_2$$
$$\phantom{-(O}\overset{R_1}{\underset{|}{\phantom{C}}}$$

Y represents $$-OH, -O-\overset{O}{\underset{\|}{C}}-\overset{R_4}{\underset{|}{C}}=CH_2, -O-\overset{O}{\underset{\|}{C}}-(CH_2)_p OH \text{ or}$$

$$-OR_5,$$

wherein $R_1$, $R_3$ and $R_4$, which are the same or different, respectively represents a hydrogen atom, or a methyl group, $R_2$ represents an alkylene group having 1 to 5 carbon atoms and a hydroxyl group, $R_5$ represents an alkyl group having 1 to 5 carbon atoms and a hydroxyl group, n is an integer of 4 to 23, m is 0 or 1 and p is an integer of 1 to 5, and
(iii) a photopolymerization initiator.

3. The resin composition according to claim 1 wherein the polymerizable monomer has at least two free hydroxyl group and the following formula:

$$\begin{array}{c} CH_2-X \\ | \\ CH-OH \\ | \\ CH_2-Y \end{array} \quad (I)$$

wherein X represents $$-(OCHCH_2)_n(O-R_2)_m O-\overset{O}{\underset{\|}{C}}-\overset{R_3}{\underset{|}{C}}=CH_2,$$
$$\phantom{-(O}\overset{R_1}{\underset{|}{\phantom{C}}}$$

Y represents $$-OH, -O-\overset{O}{\underset{\|}{C}}-\overset{R_4}{\underset{|}{C}}=CH_2, -O-\overset{O}{\underset{\|}{C}}-(CH_2)_p OH \text{ or}$$

$$-OR_5,$$

wherein $R_1$, $R_3$ and $R_4$, which is the same or different, respectively represents a hydrogen atom or a methyl group, $R_2$ represents an alkylene group having 1 to 5 carbon atoms and a hydroxyl group, $R_5$ represents an alkyl group having 1 to 5 carbon atoms and a hydroxyl group, n is an integer of 4 to 23, m is 0 or 1 and p is an integer of 1 to 5.

4. The resin composition according to claim 1 wherein the polymerization monomer is $$CH_2=CH-COOCH_2\underset{\underset{OH}{|}}{CH}CH_2O-(CH_2CH_2O)_9-CH_2-\underset{\underset{OH}{|}}{CH}-\underset{\underset{OH}{|}}{CH_2}$$

$$CH_2=\underset{\underset{CH_3}{|}}{C}-COOCH_2\underset{\underset{OH}{|}}{CH}CH_2O-(CH_2CH_2O)_9CH_2\underset{\underset{OH}{|}}{CH}-\underset{\underset{OH}{|}}{CH_2}$$

$$CH_2=CH-COOCH_2\underset{\underset{OH}{|}}{CH}CH_2O-(CH_2CH_2O)_9CH_2\underset{\underset{OH}{|}}{CH}CH_2OCOCH=CH_2$$

$$CH_2=\underset{\underset{CH_3}{|}}{C}-COOCH_2\underset{\underset{OH}{|}}{CH}CH_2O-(CH_2CH_2O)_9CH_2\underset{\underset{OH}{|}}{CH}CH_2OCO\underset{\underset{CH_3}{|}}{C}=CH_2$$

$$CH_2=CH-COO-(CH_2CH_2O)_9CH_2\underset{\underset{OH}{|}}{CH}-\underset{\underset{OH}{|}}{CH_2} \text{ or}$$

$$CH_2=\underset{\underset{CH_3}{|}}{C}-COO-(CH_2CH_2O)_9CH_2\underset{\underset{OH}{|}}{CH}-\underset{\underset{OH}{|}}{CH_2}$$

5. The resin composition according to claim 1 or claim 2 wherein the photopolymerization initiator is an aromatic ketone.

6. The resin composition according to claim 1 comprising 50 to 300 parts of the component (i), and 0.01 to 10 parts of the component (iii) based on 100 parts of the component (ii).

7. The resin composition according to claim 1 or claim 2 having a water content of not more than 10% by weight.

8. A water-developable photosensitive resin plate which comprises a substrate and a water-developable photosensitive resin composition formed thereon, said water-developable photosensitive resin composition being that according to claim 1 or claim 2.

9. A relief printing plate which is prepared by the use of the photosensitive resin plate according to claim 8.

10. A method for preparing a relief printing plate comprising subjecting the photosensitive resin plate according to claim 8 to light through a negative film having an image and then washing the photosensitive composition at the unexposed part with water.

11. A method for preparing a water-developable photosensitive resin plate suitable for the manufacture of a relief printing plate, which comprises applying by hot melt molding a water-developable photosensitive resin composition to a substrate in which said water-developable photosensitive resin composition is that according to claim 1 or claim 2.

12. The method according to claim 11 wherein said water-developable photosensitive resin composition has a water content of not more than 10% by weight.

13. A method for preparing a relief printing plate comprising subjecting the photosensitive resin plate prepared according to claim 11 to light through a negative film having an image and then washing the photosensitive composition at the unexposed part with water.

14. The resin composition according to claim 1 wherein said vinyl ester is vinyl acetate.

15. The resin composition according to claim 1 wherein said salt of the sulfonic acid group containing monomer is sodium (meth)allylsulfonate or sodium vinylsulfonate.

16. The resin composition according to claim 1 wherein said nonionic monomer is a $C_1$–$C_{10}$ alkyl acrylate.

17. The resin composition according to claim 1 wherein said polyvinyl alcohol has a saponification degree of 55 to 68 mol %.

18. The resin composition according to claim 2, wherein the monomers of said copolymer to be saponified further contains (c) a monomer selected from the group consisting of a nonionic monomer, a sulfonic acid group-containing monomer, a salt of the sulfonic acid group-containing monomer, and a mixture thereof, in addition to the monomers (a) and (b').

19. The resin composition according to claim 18 wherein said salt of the sulfonic acid group containing monomer is sodium (meth)allylsulfonate or sodium vinylsulfonate.

20. The resin composition according to claim 18 wherein said nonionic monomer is a $C_1$–$C_{10}$ alkyl acrylate.

21. The resin composition according to claim 2 wherein said vinyl ester is vinyl acetate.

22. The resin composition according to claim 2 wherein said polyvinyl alcohol has a saponification degree of 55 to 68 mol %.

23. The resin composition according to claim 2, comprising 50 to 300 parts of the component (i'), and 0.01 to 10 parts of the component (iii), based on 100 parts of the component (ii').

* * * * *